United States Patent [19]

Smith et al.

[11] Patent Number: 5,328,785
[45] Date of Patent: Jul. 12, 1994

[54] HIGH POWER PHASE MASKS FOR IMAGING SYSTEMS

[75] Inventors: Adlai H. Smith, San Diego; Robert O. Hunter, Jr., Rancho Santa Fe, both of Calif.

[73] Assignee: Litel Instruments, San Diego, Calif.

[21] Appl. No.: 833,939

[22] Filed: Feb. 10, 1992

[51] Int. Cl.$^5$ .............................................. G03F 9/00
[52] U.S. Cl. ......................................... 430/5; 430/2; 430/322; 430/323; 156/643
[58] Field of Search ....................... 430/5, 322, 323, 2; 156/643

[56] References Cited
U.S. PATENT DOCUMENTS
4,902,899  2/1990  Lin et al. .................................. 430/5

Primary Examiner—Marion E. McCamish
Assistant Examiner—Mark A. Chapman
Attorney, Agent, or Firm—Brown, Martin, Haller & McClain

[57] ABSTRACT

The phase mask comprises binary square wave gratings which deflect light away from the collecting aperture of the projection system and binary phase gratings which deflect the incident light into a fan of rays to fill the collecting aperture. In the transmissive regions, the mask consists of randomly-placed squares etched to a depth corresponding to a half wave retardation and filling approximately fifty percent of the area within the transmissive region. The "blocking" regions consist of a binary grating etched to the same depth as that of the transmissive region but having sufficiently high spatial frequency to deflect the incident light to points outside of the collecting aperture.

5 Claims, 2 Drawing Sheets

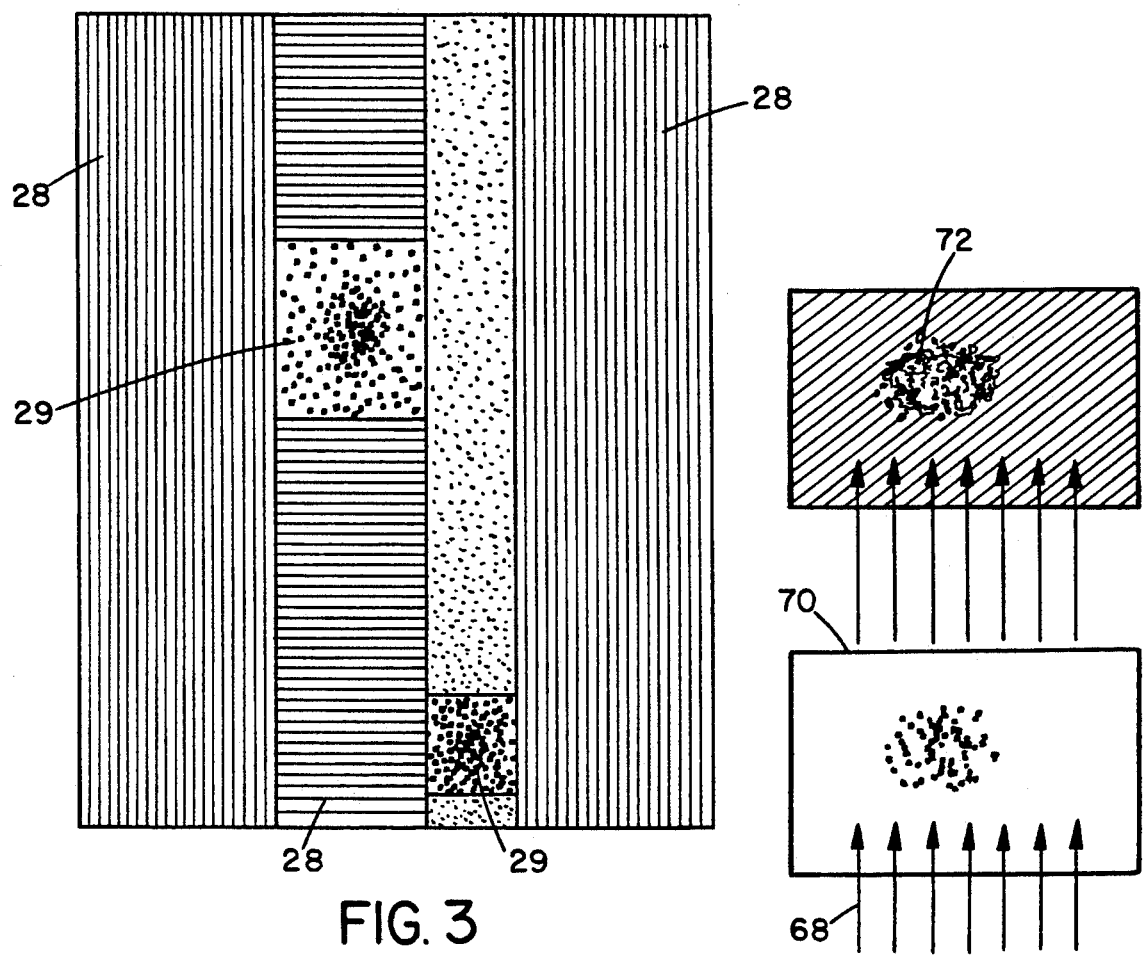
FIG. 3
FIG. 6 PRIOR ART
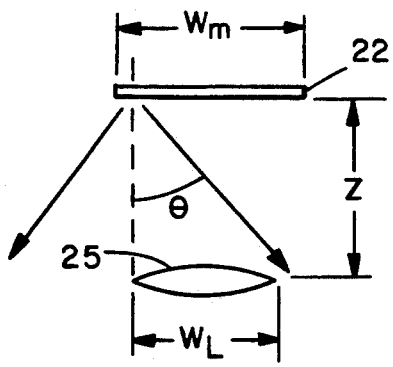
FIG. 5
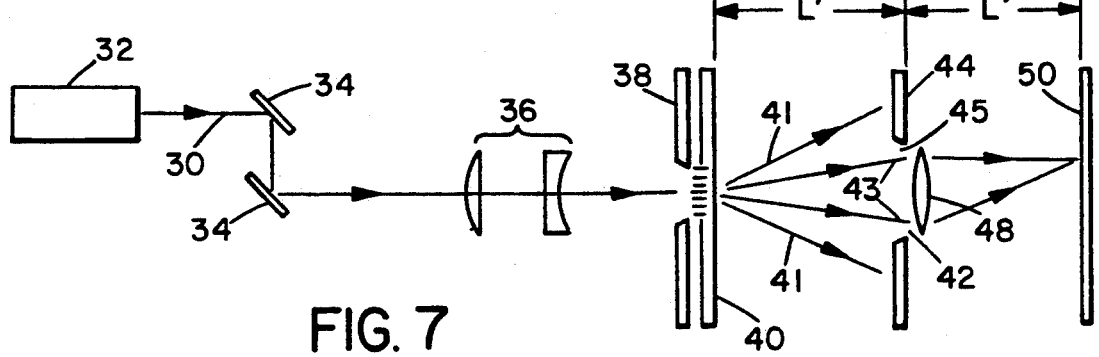
FIG. 7

HIGH POWER PHASE MASKS FOR IMAGING SYSTEMS

BACKGROUND OF THE INVENTION

Projection imaging systems are widely used in photolithographic steps of semiconductor fabrication and in laser machining of metals, ceramics and polyimide. A conventional projection system includes a light source, a mask consisting of transmitting and blocking regions, and projection optics. When the light source is a laser, the additional element of a diffuser is included to make the light spatially incoherent to minimize the occurrence of standing waves resulting from interference fringes. Diffusers can typically be a fly's eye beam scrambler or a cloud-like scattering element, and must be capable of handling high power illumination.

Imaging system masks modulate light by selectively reflecting and/or absorbing the light at the blocking regions. Three commonly used mask types are metal, chrome on glass and dielectric.

Metal masks are formed by cutting or etching holes in sheet metal. The blocking mechanism is partial reflection and absorption of the incident light. At high powers and/or extended exposures, absorption of light heats the mask and distorts it from its intended shape. As a result, metal masks for use with high power lasers generally require active cooling.

Chrome-coated glass masks use reflection as the blocking mechanism. However, enough incident light is still absorbed by the blocking portion that, especially at ultraviolet wavelengths, over time the thin chrome film erodes, generating mask defects. It is known that bridged areas on chrome masks can be corrected by burning off the defect with a laser, so it is clear that chrome masks are severely limited in their use with high power lasers of at least certain wavelengths.

Dielectric masks use reflection as a blocking mechanism and exhibit negligible absorption. However, for pulsed operation in the ultraviolet range, the damage threshold of a dielectric mask is typically 1-3 Joules/$cm^2$ due to the fragile nature of the reflective coating on the mask.

From diffraction theory, it is known that binary phase plates will modify the wavefront of incident light which is coherent and has a narrow bandwidth by using steps proportional to one-half the wavelength of the incident light to advance or retard phase or to scatter the light exiting from the phase plate.

Phase plates are relatively easy to manufacture in that common lithographic techniques can be used. Phase plates also have the advantage that, since they are diffractive elements, there is no significant absorption and, therefore, no heat-induced distortion or erosion of the pattern. Since they do not rely on reflection of any kind, optical coatings are not required. Thus, a phase mask possesses none of the negative qualities of the above-described mask types.

It would be desirable to provide a mask for use in high power laser processes which possesses the advantages of phase plates while still allowing the same or better masking of the pattern to be projected upon the workpiece as can be accomplished using conventional masking techniques. It is to such an objective that the present invention is directed.

SUMMARY OF THE INVENTION

It is an advantage of the present invention to provide a mask for projection imaging systems which can withstand high fluences without damage.

It is a further advantage of the present invention to provide a mask for projection imaging which exhibits sufficiently small absorption such that no heat-induced distortion occurs.

It is still another advantage of the present invention to provide a mask for projection imaging systems which is relatively easy to manufacture.

In an exemplary embodiment, the phase mask consists of binary square wave gratings which deflect light away from the collecting aperture of the projection system and binary phase gratings which deflect the incident light into a fan of rays to fill the collecting aperture or entrance pupil of the optical imaging system. In the transmissive regions, the mask consists of randomly-placed squares etched to a depth corresponding to a half wave retardation of the phase of the incident light, and filling approximately fifty percent of the area within the transmissive region. The transmissive region also serves as a diffuser, thereby eliminating the need for a separate diffuser element. The "blocking" regions consist of a binary grating etched to the correct depth for half wave phase advancement/retardation and having a sufficiently high spatial frequency to deflect the incident light to points outside of the collecting aperture.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 3 is a schematic example of a phase mask for producing two square features;

FIG. 5 is an illustration of minimum throw angle constraints;

FIG. 6 is an exemplary diffraction pattern produced by a random array of rectangular holes; and FIG. 7 is a diagrammatic view of an exemplary imaging system.

DETAILED DESCRIPTION OF THE PREFERRED EMBODIMENTS

Figure 1:
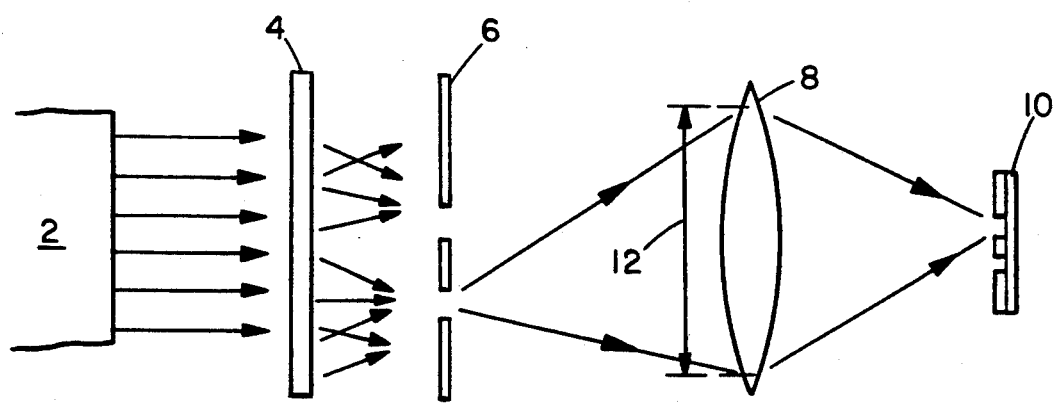
FIG. 1 is a diagrammatic view of a conventional projection imaging system.

FIG. 1 illustrates a typical configuration for a prior art projection imaging system. The basic components of the projection system are the light source 2, diffuser 4, mask 6, projection optics 8 and workpiece 10. Diffuser 4 is required primarily to make the incident light spatially incoherent when the light source 2 is a laser. Mask 6 selectively blocks or transmits the incident light to be picked up in the collecting aperture 12 of projection optics 8. The mask achieves its blocking function by either reflecting or absorbing the incident light at the blocked regions.

Figure 2:
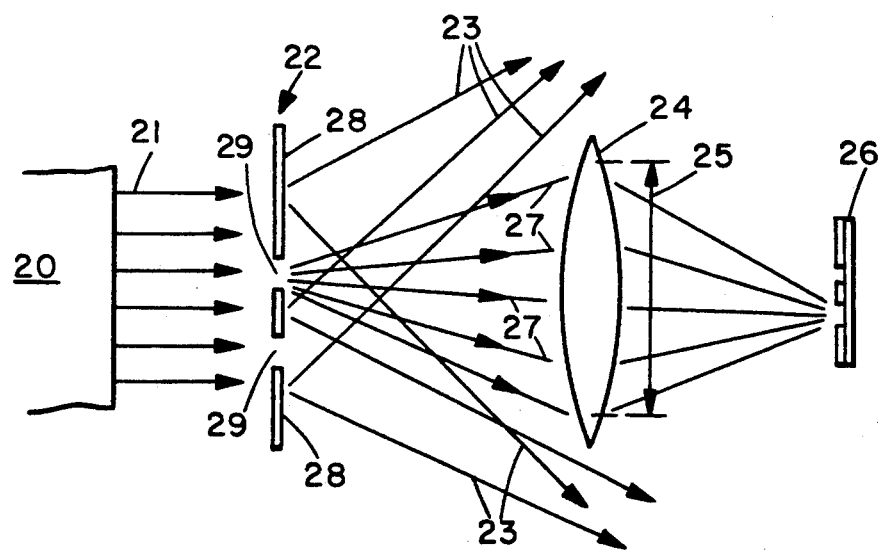
FIG. 2 is a diagrammatic view of the phase mask projection system of the present invention.

FIG. 2 illustrates an exemplary embodiment of the phase mask projection system comprising a laser light source 20, phase mask 22, projection optics 24 and workpiece 26. The incident light rays 21 impinge upon mask 22 and are either scattered away from collecting aperture 25 as rays 23 or are directed toward the collecting aperture 25, as are rays 27. Rays 23 have been scattered by the blocking region 28 of mask 22 so that they are prevented from entering the projection optics 24. Thus, projection optics 24 relay only the information from the transmissive portion 29 of the mask which is to be projected upon workpiece 26.

Figure 4A:
FIGS. 4a and 4b are diagrammatic side views of "blocking" gratings.

Illustrated in FIG. 3 is an exemplary phase mask for producing two square features. The blocking areas 28 of the phase mask consist of a binary square wave phase grating, as illustrated in FIG. 4a. The phase grating represents a phase $\phi(x)$ according to equation 1.

$$\phi(x) = \begin{cases} \pi & \left(\frac{x}{\Lambda} - \left[\frac{x}{\Lambda}\right]\right) \leq \frac{1}{2} \\ 0 \to & \text{otherwise} \end{cases} \quad (1)$$

The grating is etched to the depth of $\lambda/2(n-1)$, where $\lambda$ is the wavelength of the incident laser light; n is the refractive index of the glass plate; and $\Lambda$ is the grating period of the grooves.

Blocking regions must then consist of a grating of sufficiently short period, $\Lambda$, that the $m = \pm 1$ orders, which are deflected at angles $\pm \lambda/\Lambda$, miss the entrance pupil (collecting aperture 25) of the projection system 24. The $m = 0$ order is passed by the projection system so that approximately 50% of the light impinging on the transmissive area is collected by the projection system.

Errors in the depth of etch will cause some light to pass straight through the "blocking" regions and be imaged onto the workpiece. If $\epsilon$ is the fractional error in depth of the grooves, then the fraction of light passing straight through and the ratio of intensities between imaged features and nominally dark areas can be readily computed. Selected values are displayed in Table 1.

TABLE 1

| $\epsilon$, % depth offset | Straight Ahead Fraction | Contrast Ratio |
| --- | --- | --- |
| 5 | .6 | 81:1 |
| 2.5 | .2 | 320:1 |
| 1 | .03 | 2000:1 |

From Table 1, depth control of ±5% or better results in contrast ratios of 80:1 or better. This degree of control is easily obtained with commercially-available dry etchers, and with careful attention, with wet etching.

In the preferred embodiment, square wave gratings are chosen for the reason that they are generally easy to fabricate. However, the grating may also be made using other periodic structures in which the etch depth $d_o$ will be determined by:

$$a_0 = \int_0^\Lambda \frac{dx}{\Lambda} e^{i\phi(x;d_0)} = 0 \quad (2)$$

The phase profile $\phi$, is immediately determined by the spatial profile of the etched grooves. For variations around the depth $d_o + \epsilon d_o$, $a_o$ is approximately equal to $\epsilon$. Therefore, as above, the 25% variation in depth will produce contrast ratios of approximately 80:1.

Figure 4B:
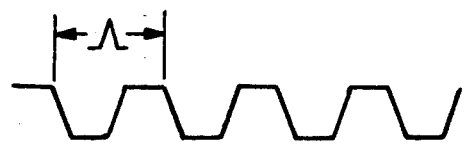

FIG. 4b illustrates an example of a periodic non-square wave profile. The sawtooth profile with sloping side walls is characteristic of an isotropic etching procedure, e.g., wet chemical etch. Variations in the depth of non-square grooves produce the same effects as for square grooves and the acceptable tolerances are smaller.

In addition to minimizing the light present in the zero$^{th}$ order, the blocking grating must scatter the higher order light at large enough angles to miss the collecting aperture of the projection optics. The deflection angle $\theta$ is given by the Bragg condition.

The grating period, $\Lambda$, is equal to twice the feature size, FS, or width of the etched grooves. For the imaging system illustrated in FIG. 5, a square mask of width $w_m$ is a distance z from the circular entrance pupil of diameter $w_1$. Assuming the mask 22 is centered on the collecting aperture 25; light from a blocking area on the edge of the mask must not reach the entrance pupil. From the geometry of FIG. 5, $\theta$ is the deflection angle for the $|m|=1$ order, requiring that:

$$\tan\left[\sin^{-1}\left(\frac{\lambda}{2FS}\right)\right] \geq \frac{1}{2} \frac{(w_m + w)}{z}. \quad (3)$$

As an example, a 2" square mask imaged using 4" circular optics at a z or working distance of 20" using an XeCl excimer laser would require a maximum feature size of 0.89 μm.

The transmitting regions of FIG. 3 consist of randomly-placed, non-overlapping squares which cover approximately 50% of the transmissive area. The individual squares produce a $\pi$ phase shift of the incident light and so act as scatterers. An algorithm for producing the transmissive regions would be to randomly pick a point P in the transmissive region. If the w×w square pixel centered on P does not intersect any previously-placed pixels, it is etched. If the pixel intersects any of its immediate neighbors, only the non-overlapping portion is etched. In this fashion, approximately 50% of the transmissive area can be etched and the resulting aperture can be described as a spectrum of different size apertures centered on w.

A randomly-placed array of pixels will produce an intensity pattern proportional to the diffraction pattern of a single pixel. The pattern produced is illustrated by FIG. 6 (taken from Born and Wolf, "Principles of Optics"), which shows the intensity pattern 72 produced by projecting light 68 through a random array of rectangular holes in aperture 70. The diffraction by a phase screen is similar to the diffraction by a transmissive mask except that diffraction by the unetched areas ($\phi = \pi$) as well as the unetched areas ($\phi = 0$), must be taken into account.

The angular intensity of the diffractive spreading will be mainly concentrated in the forward direction and, therefore, pixels at a distance from the optical axis will have less of their scattered light collected by the collecting aperture than an on-axis pixel will. The details of the angular distribution will depend on the distribution of sizes, shapes and density of the etched pixels. In addition, the unetched part of the transmissive region, the region complimentary to the etched part, also scatters light and does so with its own characteristic angular distribution. The result of these effects is some net non-uniformity in the image plane illumination. The non-uniformity can be largely removed by biasing the laser beam to do a lateral scan, or by etching less than 50% of the transmitting area in some regions.

FIG. 7 illustrates an exemplary KrF 1:1 imaging system with a ⅓" square field. The KrF laser 32 emits a beam 30 toward beam scanners 34 and on to 3:1 reduction telescope 36. A metal beam blocker 38 consisting of a ⅓"×⅓" square aperture is positioned in front of holographic phase mask 40 to prevent stray light from being transmitted. Phase mask 40 is wet etched with a feature size of 3.5 microns and can tolerate fluences of >1 J/cm². Phase mask 40 scatters undesired light 41 at a wide angle to avoid collecting aperture 42 and transmits diffused light 43 to fill collecting aperture 42 with the pattern to be transferred. A second metal beam blocker 44 has an aperture 45 to apodize the undesired orders of the transmitted light 43. Here, aperture 45 is a 1" diameter circle. Projection optic 48 is any suitable 1" projection optic consisting of single or multiple lenses. The workpiece 50 is positioned 35.4" (899 mm) from projection optic 48, and, in this example, is polyimide.

The above description provides a general holographic technique for generating high power masks for imaging systems. This technique is limited in its power handling capacity only by the damage threshold of the uncoated refractive material from which the CGH is made. The damage threshold is, therefore, significantly higher than both the damage thresholds of coated materials and the power levels at which absorptive masks will warp. While the examples provided describe KrF excimer laser applications, the inventive technique is applicable to any high power laser process, including those using other excimer lasers, YAG and $CO_2$. It may be noted that due to the relatively long wavelength, masks for $CO_2$ lasers can be made using low cost laser printers rather than the more costly E-beam procedures required for shorter wavelength lasers.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A method for modulating a laser beam for selectively etching material from a workpiece, said method which comprises:

selecting a plate of refractive material transmissive at a wavelength of said laser beam, said plate having a transmissive area greater than an area of a cross-section of said laser beam;

forming at least one first region comprising a binary phase grating with a first grating depth which scatters all incident light which impinges upon said at least one first region at a high angle to avoid said workpiece;

forming at least one second region comprising a binary phase grating having a random arrangement of non-overlapping regions with a second grating depth the same as said first grating depth; and scanning said laser beam over said plate to cover said transmissive area of said plate so that said scanned laser beam is transmitted through said plate so that a portion of said scanned laser beam impinging upon said first region is deflected away from said workpiece and a second portion of said scanned laser beam impinging upon said second region is diffracted toward said workpiece wherein material is etched from at least one portion of said workpiece illuminated by said laser beam transmitted through said second region.

2. A method for direct selective ablation of material from a workpiece using a high power laser beam, the method which comprises:

providing a plate of refractive material transmissive at a wavelength of said high power laser beam, said plate having an area greater than an area of a cross-section of said high power laser beam;

forming at least one transmissive region comprising a binary phase grating having a first grating depth for diffracting all incident light impinging upon said at least one transmissive region at an angle less than or equal to a collection angle so that said high power laser beam impinges upon said workpiece;

forming at least one scattering region comprising a binary phase grating having a second grating depth which scatters all incident light from said high power laser beam which impinges upon said at least one scattering region at a high angle greater than said collection angle to prevent said high power laser beam for impinging upon said workpiece; and scanning said high power laser beam over said plate to cover said area of said plate so that a portion of said scanned high power laser beam impinging upon said scattering region is deflected away from said workpiece and the portion of said scanned high power laser beam impinging upon said transmissive region is diffracted toward said workpiece wherein material is ablated from portions of said workpiece illuminated by said high power laser beam which is transmitted through said transmissive region.

3. A method as in claim 2 wherein the step of forming at least one transmissive region comprises creating a random arrangement of nonoverlapping regions with a first grating depth the same as said second grating depth.

4. A method as in claim 2 wherein the step of forming at least one blocking region comprises forming a binary square wave phase grating.

5. A method as in claim 2 wherein the step of forming at least one blocking region includes determining said second grating depth according to a condition that said at least one blocking region scatters all incident light at an angle greater than said collection angle.

* * * * *